(12) United States Patent
Kurita

(10) Patent No.: US 6,856,858 B2
(45) Date of Patent: Feb. 15, 2005

(54) SHARED SENSORS FOR DETECTING SUBSTRATE POSITION/PRESENCE

(75) Inventor: Shinichi Kurita, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 24 days.

(21) Appl. No.: 10/601,098

(22) Filed: Jun. 20, 2003

(65) Prior Publication Data

US 2004/0055397 A1 Mar. 25, 2004

Related U.S. Application Data

(60) Provisional application No. 60/390,764, filed on Jun. 21, 2002.

(51) Int. Cl.$^7$ ................................................ G06F 7/00
(52) U.S. Cl. ...................................... 700/218; 414/936
(58) Field of Search ................................ 700/213, 218; 414/935, 936

(56) References Cited

U.S. PATENT DOCUMENTS

| | | |
|---|---|---|
| 5,452,521 A | 9/1995 | Niewmierzycki |
| 5,483,138 A | 1/1996 | Shmookler et al. |
| 5,917,601 A | 6/1999 | Shimazaki et al. |
| 6,120,601 A | 9/2000 | Landau et al. |
| 6,190,037 B1 * | 2/2001 | Das et al. ................... 374/121 |
| 6,327,517 B1 | 12/2001 | Sundar |
| 6,339,730 B1 | 1/2002 | Matsushima |
| 6,502,054 B1 * | 12/2002 | Mooring et al. ............ 702/150 |
| 6,556,887 B2 * | 4/2003 | Freeman et al. ............ 700/218 |
| 6,629,053 B1 * | 9/2003 | Mooring ..................... 702/94 |

FOREIGN PATENT DOCUMENTS

| | | |
|---|---|---|
| EP | 0 891 840 A1 | 1/1999 |
| EP | 1 102 137 A2 | 5/2001 |

* cited by examiner

Primary Examiner—Khoi H. Tran
(74) Attorney, Agent, or Firm—Dugan & Dugan

(57) ABSTRACT

A transfer chamber of a semiconductor processing tool is adapted to couple to plural process and/or load lock chambers. A reduced number of substrate sensors are provided in the transfer chamber to confirm the presence and/or positioning of substrates with respect to the process and/or load lock chambers. In one embodiment, each process and/or load lock chamber may share sensors with adjacent chambers and with chambers that are not adjacent.

17 Claims, 6 Drawing Sheets

| Chamber | Reference Numerals of Sensors Which Serve the Chamber |
|---|---|
| First 22-1 | 27-1, 27-2, 27-10, 27-13 |
| Second 22-2 | 27-2, 27-3, 27-11, 27-14 |
| Third 22-3 | 27-3, 27-4, 27-8, 27-12 |
| Fourth 22-4 | 27-4, 27-5, 27-9, 27-13 |
| Fifth 22-5 | 27-5, 27-6, 27-10, 27-14 |
| Sixth 22-6 | 27-6, 27-7, 27-8, 27-11 |
| Seventh 22-7 | 27-1, 27-7, 27-9, 27-12 |

FIG. 3

SHARED SENSORS FOR DETECTING SUBSTRATE POSITION/PRESENCE

The present application claims priority from U.S. Provisional Patent Application Ser. No. 60/390,764, filed Jun. 21, 2002, which is hereby incorporated by reference herein in its entirety.

FIELD OF THE INVENTION

This invention is concerned with semiconductor substrate processing, and is more particularly concerned with sensors for detecting substrate position/presence within a transfer chamber to which substrate processing chambers may be coupled.

BACKGROUND OF THE INVENTION

FIG. 1 is a somewhat schematic plan view of a conventional substrate processing tool 11 of the type which is used to apply semiconductor manufacturing processes to substrates such as silicon wafers or glass plates. As is familiar to those who are skilled in the art, silicon wafers may be used for fabrication of semiconductor devices such as processors, memory devices, etc. Glass plates may be processed to manufacture flat panel displays for use as computer monitors, television displays or the like.

The processing tool 11 includes a centrally located transfer chamber 13, to which process chambers 15 are coupled. In each of the chambers 15, a semiconductor fabrication process such as thin film deposition, oxidation or nitridization, etching, or thermal or lithographic processing, may be performed. Substrates to be processed in the processing tool 11 are introduced into the processing tool 11 via at least one load lock chamber 17 coupled to the transfer chamber 13. A substrate handling robot 19 is installed in the transfer chamber 13 to transfer substrates among the load lock chamber 17 and the process chambers 15.

It is known to equip a transfer chamber of a processing tool with sensors for detecting whether a substrate is present and is properly positioned for loading into one of the process, load lock, or other chambers coupled to the transfer chamber. In one conventional processing tool which is adapted to process rectangular glass plates, and which has seven chambers coupled to it (e.g., six process chambers and a load lock chamber such as is shown in FIG. 1), a total of twenty-eight sensors are employed. That is, a group of four sensors is arranged in the transfer chamber adjacent each opening in the transfer chamber which connects to a respective one of the seven chambers coupled to the transfer chamber. Each of the four sensors in a group of sensors is provided to detect the presence and correct positioning of a respective corner of the rectangular glass plate. The group of four sensors adjacent a particular process chamber or load lock chamber may be used to confirm that a glass plate is properly positioned adjacent the process chamber or load lock chamber, before motion of the substrate handling robot is initiated to load the glass plate into the process chamber or load lock chamber.

Although conventional sensor arrangements perform satisfactorily for their intended purpose, it would be desirable to reduce the cost of providing sensors and installing them in a transfer chamber.

SUMMARY OF THE INVENTION

According to a first aspect of the invention, an apparatus for detecting substrates includes a transfer chamber adapted to couple to a plurality of other chambers, the other chambers including at least one processing chamber and at least one load lock chamber. The inventive apparatus further includes a first group of sensors positioned in the transfer chamber to indicate that a substrate is disposed for loading into a first one of the other chambers and a second group of sensors positioned in the transfer chamber to indicate that a substrate is disposed for loading into a second one of the other chambers. The second one of the other chambers is not adjacent the first one of the other chambers, and at least one sensor of the first group of sensors also belongs to the second group of sensors.

According to a second aspect of the invention, an apparatus for detecting substrates includes a transfer chamber adapted to couple to at least one processing chamber and at least one load lock chamber. The apparatus according to the second aspect of the invention also includes a first ring of sensors disposed within the transfer chamber at a first radius from a center of the transfer chamber, and a second ring of sensors disposed within the transfer chamber at a second radius from the center of the transfer chamber. The sensors are positioned and the first radius and the second radius are selected so that a position of a four-sided substrate may be detected in front of an opening of each processing chamber and load lock chamber coupled to the transfer chamber without requiring four separate sensors for each processing chamber and load lock chamber coupled to the transfer chamber. Numerous other aspects are provided, as are methods and systems in accordance with these and other aspects of the invention.

With the apparatus and methods of the present invention, the number of sensors required to detect the presence and/or proper positioning of a substrate in a transfer chamber may be greatly reduced. For example, in a transfer chamber adapted for coupling to seven other chambers and for transferring rectangular substrates, the number of sensors required may be cut in half, i.e., from twenty-eight to fourteen. Consequently, the cost of manufacturing the transfer chamber may be reduced.

Other features and aspects of the present invention will become more fully apparent from the following detailed description of exemplary embodiments, the appended claims and the accompanying drawings.

BRIEF DESCRIPTION OF THE DRAWINGS

FIG. 3 is a table which identifies groups of the sensors of FIGS. 2A–C which respectively serve chambers coupled to the transfer chamber of FIGS. 2A–C.

DETAILED DESCRIPTION

In accordance with an aspect of the invention, substrate detecting sensors are arranged in a transfer chamber of a processing tool in such a manner that each sensor is used to detect the presence of substrates relative to more than one process, load lock or other chamber coupled to the transfer chamber. In this manner, sensors are "shared" by more than one of the chambers coupled to the transfer chamber. According to at least one aspect of the invention, two chambers which "share" a sensor need not be adjacent each other (e.g., the two chambers may be separated by one or more other chambers).

Figure 2A:
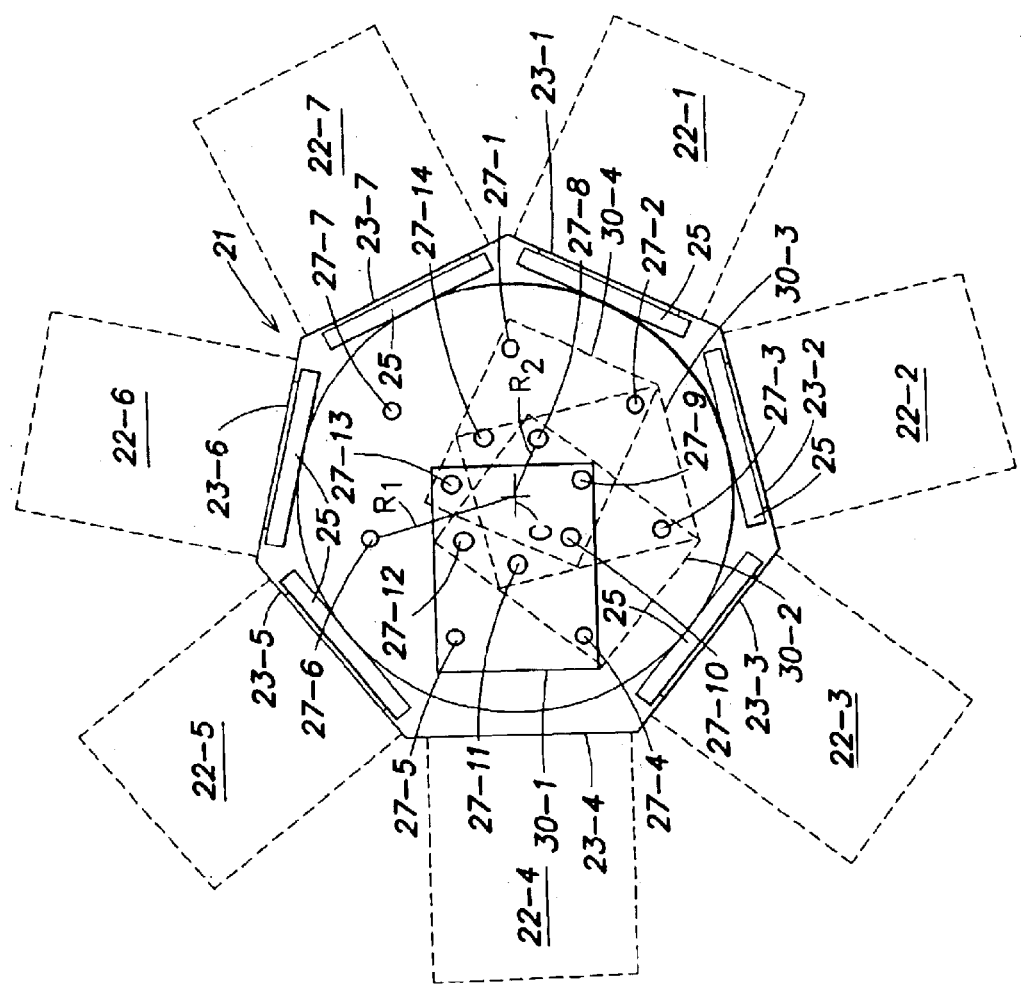
FIGS. 2A–C are schematic plan views of a processing tool transfer chamber including substrate sensors arranged in accordance with an embodiment of the present invention.
Figure 2B:
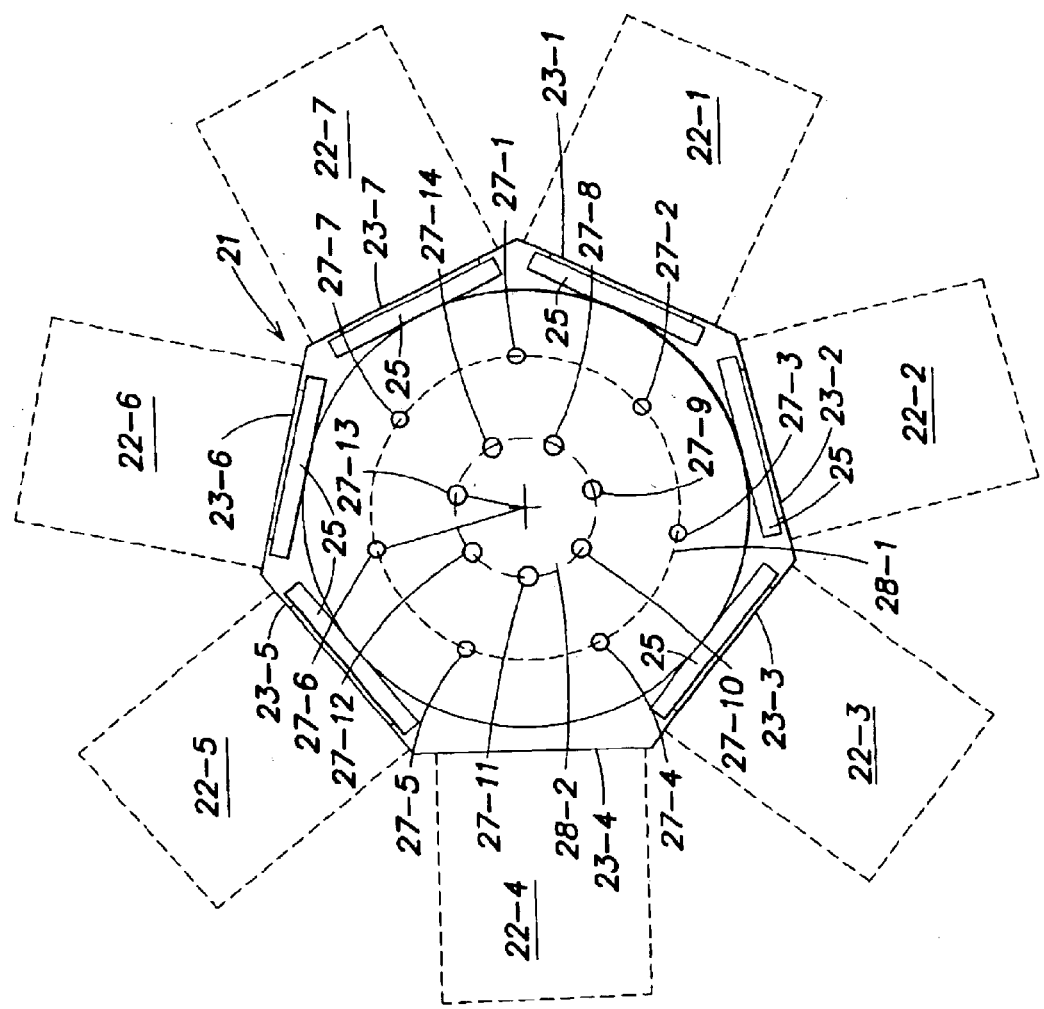
Figure 2C:
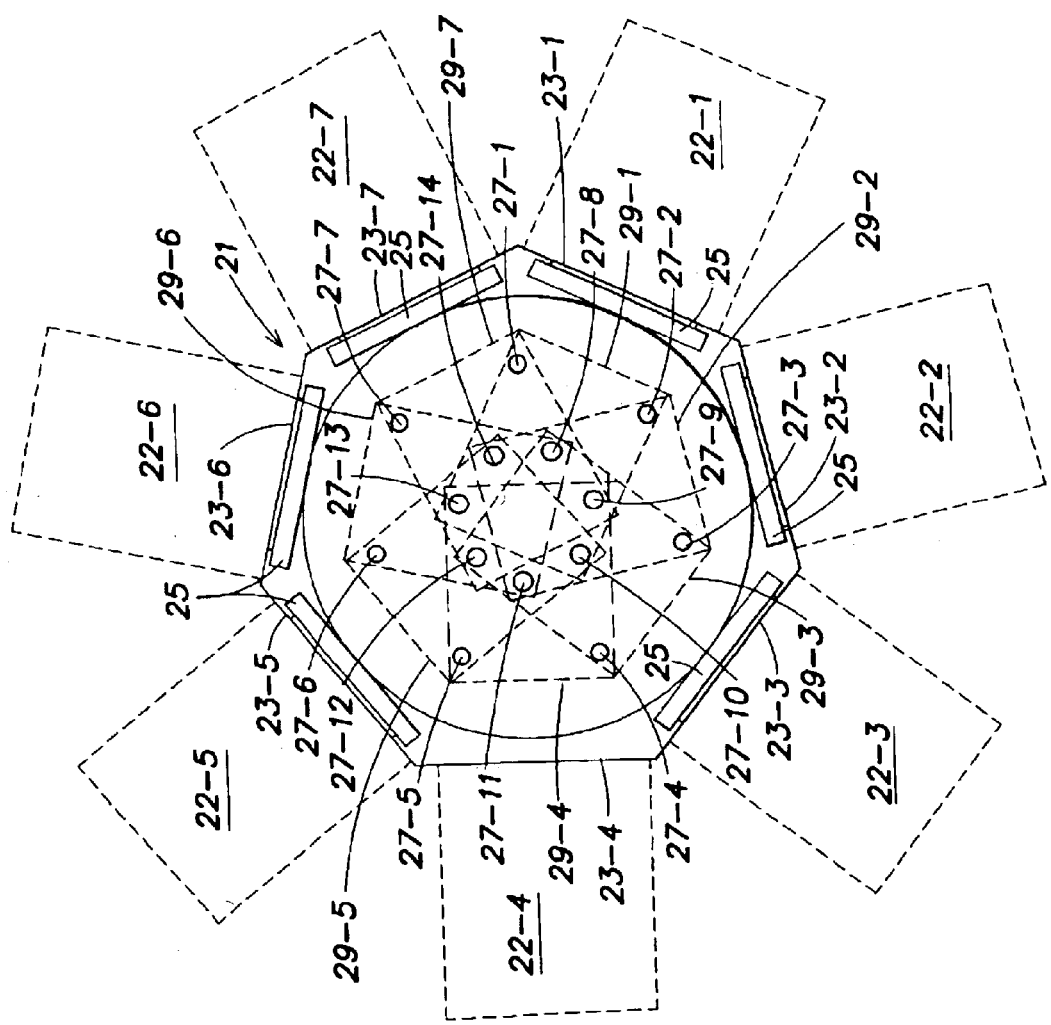

FIGS. 2A–C are schematic plan views of a transfer chamber 21 provided in accordance with the present invention. To simplify the drawing, chambers that are or may be coupled to the transfer chamber 21 are shown in phantom and are referred to by reference numerals 22-1 through 22-7. In the particular embodiment illustrated in FIGS. 2A–C, the transfer chamber 21 has seven sides, each of which is adapted to couple to a respective process or load lock chamber. The transfer chamber 21 may, for example, be of the type available from AKT, Inc., such as the AKT 10k or 15k transfer chamber.

With reference to FIG. 2A, the seven sides of the transfer chamber 21 include a first side 23-1, a second side 23-2, a third side 23-3, a fourth side 23-4, a fifth side 23-5, a sixth side 23-6 and a seventh side 23-7. In the particular embodiment shown, the sides 23-1, 23-2, 23-3, 23-5, 23-6 and 23-7 are adapted to couple to process chambers (chambers 22-1, 22-2, 22-3, 22-5, 22-6 and 22-7, respectively). For that purpose, conventional process chamber interfaces 25 such as slit valves or the like are associated with those six sides of the transfer chamber 21. In this embodiment, the fourth side 23-4 of the transfer chamber 21 is adapted to couple to a load lock chamber (chamber 22-4), which may be, for example, a conventional double dual slot load lock (DDSL) or other conventional load lock chamber. The process chambers coupled to the transfer chamber 21 may perform conventional processes such as thin film deposition, oxidation or nitridization, etching, or photolithography. One or more of the process chambers may be a so-called "auxiliary" process chamber, which performs a function such as heat treatment, cool-down, ashing, or substrate orienting.

Figure 1:
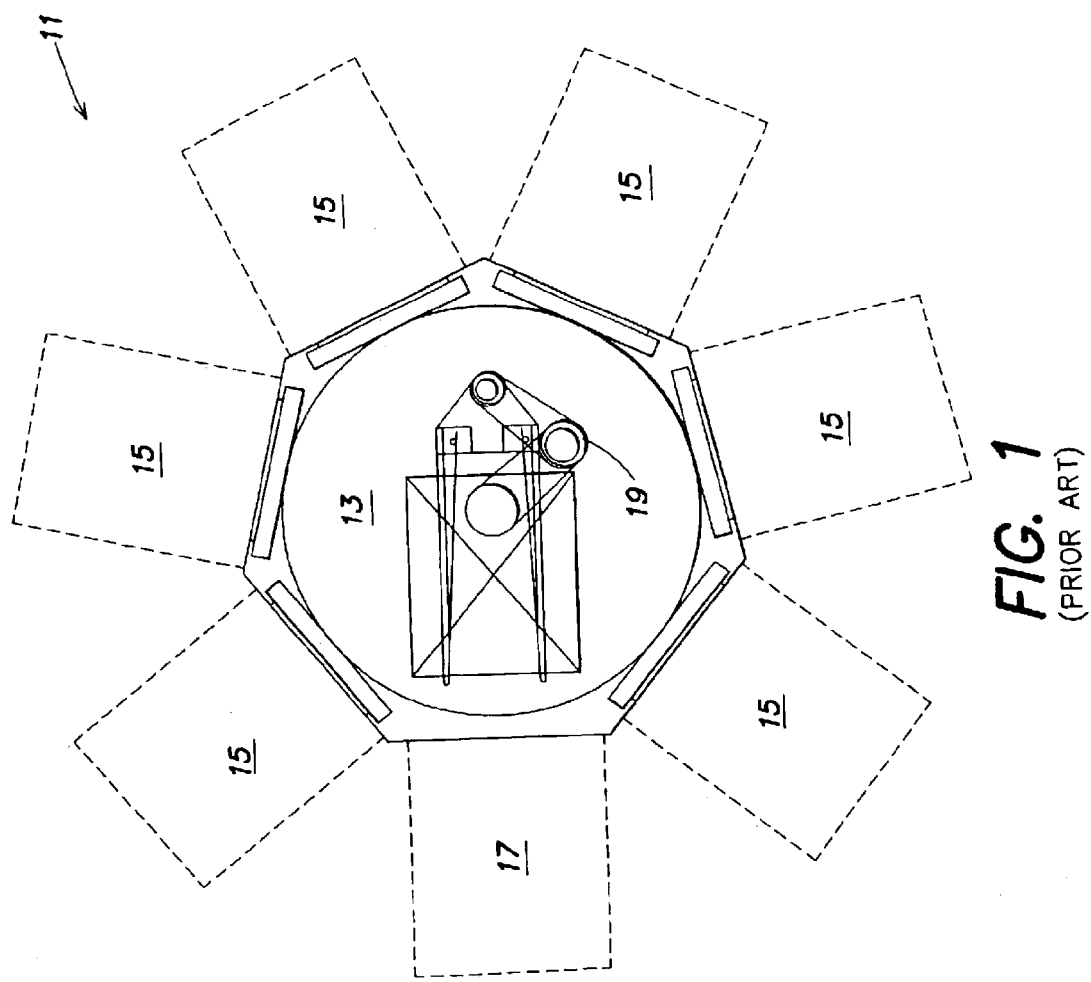
FIG. 1 is a schematic plan view of a conventional processing tool in which semiconductor fabrication processes are applied to substrates.

A conventional substrate handling robot (such as is shown in FIG. 1) may be disposed in the transfer chamber 21 to transfer substrates among the chambers coupled to the transfer chamber 21.

In the particular embodiment illustrated in FIGS. 2A–C, fourteen substrate detection sensors are installed in the transfer chamber 21. The fourteen sensors include a first sensor 27-1, a second sensor 27-2, a third sensor 27-3, a fourth sensor 27-4, a fifth sensor 27-5, a sixth sensor 27-6, a seventh sensor 27-7, an eighth sensor 27-8, a ninth sensor 279, a tenth sensor 27-10, an eleventh sensor 27-11, a twelfth sensor 27-12, a thirteenth sensor 27-13 and a fourteenth sensor 27-14. As seen from FIGS. 2A–B, the first through seventh sensors (reference numerals 27-1 through 27-7) constitute a first (outer) ring of sensors 28-1 disposed at a first radius $R_1$ from a center C of the transfer chamber 21. The eighth through fourteenth sensors (reference numerals 27-8 through 27-14) constitute a second (inner) ring of sensors 28-2 disposed at a second radius $R_2$ from the center C of the transfer chamber 21. The sensors 27-1 through 27-14 are positioned, and the first radius $R_1$ and the second radius $R_2$ are selected so that a presence and/or position of a four-sided substrate may be detected in front of an opening of each of the process and load lock chambers 22-1 through 22-7 coupled to the transfer chamber 21 without requiring four separate sensors for each process chamber and load lock chamber 22-1 through 22-7 coupled to the transfer chamber 21. It will be observed that the two radii $R_1$, $R_2$ are different from each other.

With reference to FIGS. 2A and 2C, the fourteen sensors 27-1 through 27-14 are divided into seven overlapping groups of four sensors each (referred to as sensor groups 29-1 through 29-7 in FIG. 2C). Each group of four sensors 29-1 through 29-7 serves to indicate whether a four-sided substrate (e.g., a glass plate) is present and/or properly positioned to be loaded into a respective one of the seven chambers 22-1 through 22-7 which are or may be coupled to the transfer chamber 21. As will be described further below, each of the seven chambers 22-1 through 22-7 shares two sensors of the outer ring of sensors 28-1 (FIG. 2B) with two adjacent chambers coupled to the transfer chamber 21. Each chamber 22-1 through 22-7 also shares two sensors of the inner ring of sensors 28-2 (FIG. 2B) with two non-adjacent chambers coupled to the transfer chamber 21. As used herein, a first chamber coupled to a transfer chamber is "adjacent" a second chamber coupled to the transfer chamber if no other chamber is coupled to the transfer chamber in between the first and second chambers. For example, in FIG. 2A, chamber 22-1 is adjacent chamber 22-2, but not adjacent chamber 22-3 (because chamber 22-2 is coupled to the transfer chamber 21 between chambers 22-1 and 22-3).

In FIG. 2A, reference numeral 30-1 indicates a substrate (glass plate) properly positioned to be loaded into the fourth chamber 22-4. It will be observed that the group of four sensors (29-4 in FIG. 2C) positioned to detect the corners of the substrate 30-1 includes the fourth sensor 27-4, the fifth sensor 27-5, the ninth sensor 27-9 and the thirteenth 27-13.

Reference numeral 30-2 (FIG. 2A) indicates, in phantom, a substrate that is properly positioned for loading into the third chamber 22-3. The group of four sensors (29-3 in FIG. 2C) positioned to detect the substrate 30-2 includes the third sensor 27-3, the fourth sensor 27-4, the eighth sensor 27-8 and the twelfth sensor 27-12.

Reference numeral 30-3 (FIG. 2A) indicates, in phantom, a substrate properly positioned for loading into the second chamber 22-2. The group of four sensors (29-2 in FIG. 2C) positioned to detect the substrate 30-3 includes the second sensor 27-2, the third sensor 27-3, the eleventh sensor 27-11 and the fourteenth sensor 27-14.

Reference numeral 30-4 (FIG. 2A) indicates, in phantom, a substrate properly positioned for loading into the first chamber 22-1. The group of four sensors (29-1 in FIG. 2C) positioned to detect the corners of the substrate 30-4 includes the first sensor 27-1, the second sensor 27-2, the tenth sensor 27-10 and the thirteenth sensor 27-13. FIG. 3 is a chart that identifies the four-sensor groups which serve each of the seven chambers 22-1 through 22-7.

Referring again to the group of four sensors (29-4 in FIG. 2C) positioned to detect the substrate 30-1, the fourth sensor 27-4 is shared by the fourth chamber 22-4 and the third chamber 22-3, which are adjacent each other, and the fifth sensor 27-5 is shared by the fourth chamber 22-4 and the fifth chamber 22-5, which are also adjacent each other. Furthermore, the thirteenth sensor 27-13 is shared by the fourth chamber 22-4 and the first chamber 22-1 (which are not adjacent each other) and the ninth sensor 27-9 is shared by the fourth chamber 22-4 and the seventh chamber 22-7, which are also not adjacent each other. In particular, it will be noted that the first and fourth chambers 22-1, 22-4 have two chambers (the second and third chambers 22-2, 22-3) intervening therebetween, whereas the fourth and seventh chambers 22-4, 22-7 also have two chambers (the fifth and sixth chambers 22-5, 22-6) intervening therebetween.

Figure 4:
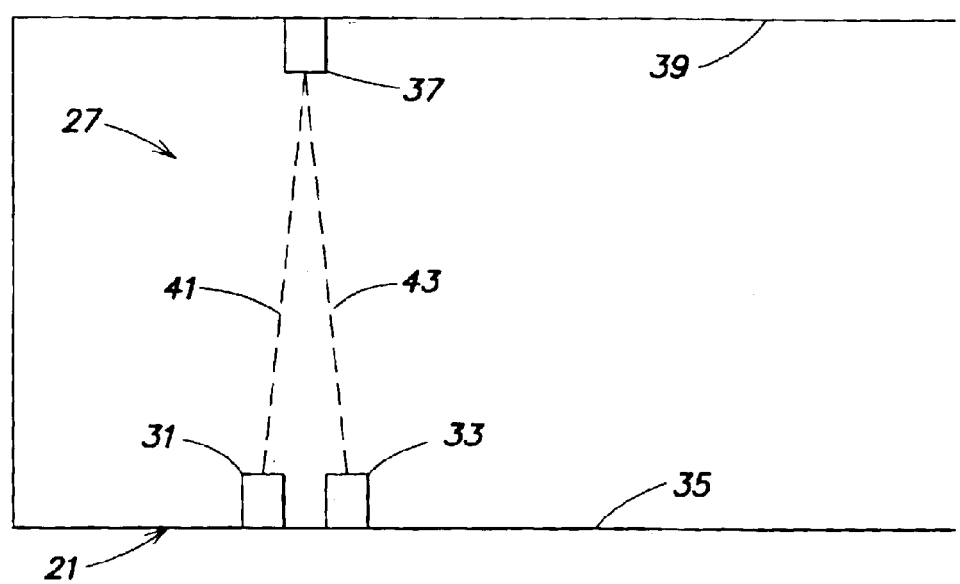
FIG. 4 is a schematic side view of the transfer chamber of FIGS. 2A–C showing a typical one of the sensors of FIGS. 2A–C.

FIG. 4 is a schematic side view of a portion of the transfer chamber 21, illustrating a typical one of the sensors 27. The sensor 27 may comprise, for example, a transmitter 31 and receiver 33 installed on a bottom wall 35 of the transfer chamber 21, and a reflector 37 installed on a top wall 39 of the transfer chamber 21. The transmitter 31 and receiver 33 may be, for example, an Omron Model No. E32-R16 sensor head having an E3X-DA6 amplifier/transmitter/receiver, which operates at 660 nanometers. The reflector 37 may be, for example, an Omron Model No. E39-R1 reflector. Other sensors, reflectors, amplifiers, transmitters, receivers, wavelengths, etc., may be employed. In at least one embodiment of the invention, a filter or similar mechanism may be employed to block thermal energy (e.g., infrared wavelengths) from reaching/heating the reflector 37 when a heated substrate is transferred within the transfer chamber 21, as such heating may affect the reflective properties of the reflector 37. For example, a filter that passes the wavelength or wavelengths emitted by the transmitter 31 but that reflects infrared wavelengths may be employed (e.g., positioned near the reflector 37).

In operation, a beam emitted by the transmitter 31 travels along a path 41 to the reflector 37 and is reflected by the reflector 37 along a path 43 back to the receiver 33. (For purposes of illustration, the lateral separation of the paths 41, 43 is exaggerated.) When a glass substrate crosses paths 41, 43, the intensity of the beam received by the receiver 33 is attenuated (e.g., via reflection at each glass/air interface encountered along paths 41, 43), indicating the presence of the substrate. Proper positioning of a substrate may be detected, for example, when all four sensors in one of the sensor groups 29-1 through 29-7 detect the presence of the substrate (e.g., as the four sensors in each group are positioned so that all of the sensors in the group detect the presence of a substrate only when the substrate is properly positioned for loading into one of the chambers 22-1 through 22-7).

Note that instead of disposing the transmitter 31 and the receiver 33 on the bottom wall 35 of the transfer chamber 21 and the reflector 37 on the top wall 39 of the transfer chamber 21, the transmitter 31 and the receiver 33 may be disposed on the top wall 39 of the transfer chamber 21 and the reflector 37 may be disposed on the bottom wall 35 of the transfer chamber 21. Other sensor locations also may be employed.

With the inventive sensor arrangement, the same substrate sensing functions are performed with a greatly reduced (e.g., 50% reduction) number of sensors, thereby providing savings both in terms of the cost of the sensors themselves, as well as the time, labor and expense entailed in installing the sensors in the transfer chamber 21.

The foregoing description discloses only exemplary embodiments of the invention; modifications of the above disclosed apparatus and methods which fall within the scope of the invention will be readily apparent to those of ordinary skill in the art. For example, the present invention is illustrated with regard to detection/positioning of rectangular glass plates, but it is also contemplated to apply the present invention to detection/positioning of other types of substrates (e.g., round substrates, semiconductor substrates, etc.).

Also, in the particular embodiment illustrated herein, a transfer chamber adapted to have seven chambers coupled thereto is shown. It is also contemplated to apply the principles of the present invention to transfer chambers adapted to couple to more or fewer than seven chambers. Also, the principles of the present invention may be applied whether or not all of the chambers that a transfer chamber may accommodate are present and/or when multiple load lock chambers are employed.

The substrate handling robot included in the inventive transfer chamber may be any type of substrate handler, and need not be the type illustrated in FIG. 1. In at least one embodiment of the invention, each sensor 27-1 through 27-14 may be configured to employ light beams which strike a substrate with non-normal incidence as disclosed in U.S. Provisional Patent Application Ser. No. 60/390,607, filed Jun. 21, 2002 and titled "Angled Sensors for Detecting Substrates" which is hereby incorporated by reference herein in it entirety. In general, any other sensor system may be employed.

While the sensor arrangement of the present invention has been described for use within a transfer chamber, it will be understood that the inventive sensor arrangement may be employed with other chambers such as a process chamber or the like. In at least one embodiment of the invention, the inventive sensor arrangement may be implemented in a transfer chamber having a domed bottom as described in U.S. Provisional Patent Application Ser. No. 60/390,629, filed Jun. 21, 2002 and titled "Transfer Chamber for Vacuum Processing System" and U.S. Provisional Patent Application Ser. No. 60/392,578, filed Jun. 28, 2002 and titled "Transfer Chamber for Vacuum Processing System", both of which are hereby incorporated by reference herein in their entirety.

All or a portion of each sensor may be located within or outside of a chamber in which the inventive sensor arrangement is employed (e.g., by transmitting light beams through one or more quartz windows in an external or partially external sensor arrangement).

Accordingly, while the present invention has been disclosed in connection with exemplary embodiments thereof, it should be understood that other embodiments may fall within the spirit and scope of the invention, as defined by the following claims.

The invention claimed is:

1. An apparatus for detecting substrates, comprising:
    a transfer chamber adapted to couple to a plurality of other chambers, the other chambers including at least one processing chamber and at least one load lock chamber;
    a first group of sensors positioned in the transfer chamber to indicate that a substrate is disposed for loading into a first one of the other chambers;
    a second group of sensors positioned in the transfer chamber to indicate that a substrate is disposed for loading into a second one of the other chambers;
    wherein:
        the second one of the other chambers is not adjacent the first one of other chambers; and
        at least one sensor of the first group of sensors also belongs to the second group of sensors.

2. The apparatus of claim 1, wherein each of the groups of sensors comprises four sensors, each adapted to detect a respective corner of a rectangular substrate.

3. The apparatus of claim 2, wherein the rectangular substrate is a glass plate.

4. The apparatus of claim 1, wherein the transfer chamber is adapted to couple to seven other chambers.

5. The apparatus of claim 4, wherein a total of fourteen sensors are disposed in the transfer chamber.

6. The apparatus of claim 1, wherein the first one of the other chambers is separated from the second one of the other chambers by at least two of the other chambers in both directions around a circumference of the transfer chamber.

7. The apparatus of claim 1, wherein no more than one sensor of the first group of sensors also belongs to the second group of sensors.

8. An apparatus for detecting substrates, comprising:
a transfer chamber adapted to couple to at least one processing chamber and at least one load lock chamber;
a first ring of sensors disposed within the transfer chamber at a first radius from a center of the transfer chamber; and
a second ring of sensors disposed within the transfer chamber at a second radius from the center of the transfer chamber;
wherein the sensors are positioned and the first radius and the second radius are selected so that a position of a four-sided substrate may be detected in front of an opening of each processing chamber and load lock chamber coupled to the transfer chamber without requiring four separate sensors for each processing chamber and load lock chamber coupled to the transfer chamber.

9. The apparatus of claim 8, wherein a total number of sensors in the first ring of sensors is equal to a total number of sensors in the second ring of sensors.

10. The apparatus of claim 9, wherein the first ring of sensors consists of seven sensors and the second ring of sensors consists of seven sensors.

11. A method of detecting substrates comprising:
positioning a first group of sensors in a transfer chamber to indicate that a substrate is disposed for loading into a first chamber coupled to the transfer chamber; and
positioning a second group of sensors in the transfer chamber to indicate that a substrate is disposed for loading into a second chamber coupled to the transfer chamber;
wherein:
the first chamber is not adjacent the second chamber; and
at least one sensor of the first group of sensors also belongs to the second group of sensors.

12. The method of claim 11, wherein each of the groups of sensors comprises four sensors, each adapted to detect a respective corner of a rectangular substrate.

13. The method of claim 11, wherein no more than one sensor of the first group of sensors also belongs to the second group of sensors.

14. A method of detecting substrates, comprising:
disposing a first ring of sensors within a transfer chamber at a first radius from a center of the transfer chamber; and
disposing a second ring of sensors within the transfer chamber at a second radius from the center of the transfer chamber;
wherein the sensors are positioned and the first radius and the second radius are selected so that a position of a four-sided substrate may be detected in front of an opening of each chamber coupled to the transfer chamber without requiring four separate sensors for each chamber coupled to the transfer chamber.

15. An apparatus for detecting substrates comprising:
a transfer chamber adapted to couple to seven other chambers, including a first chamber, a second chamber, a third chamber, a fourth chamber, a fifth chamber, a sixth chamber and a seventh chamber; and
fourteen sensors disposed in the transfer chamber, including a first sensor, a second sensor, a third sensor, a fourth sensor, a fifth sensor, a sixth sensor, a seventh sensor, an eighth sensor, a ninth sensor, a tenth sensor, an eleventh sensor, a twelfth sensor, a thirteenth sensor and a fourteenth sensor;
wherein:
the first, second, tenth and thirteenth sensors are positioned to detect whether a substrate is disposed for loading into the first chamber;
the second, third, eleventh and fourteenth sensors are positioned to detect whether a substrate is disposed for loading into the second chamber;
the third, fourth, eighth and twelfth sensors are positioned to detect whether a substrate is disposed for loading into the third chamber;
the fourth, fifth, ninth and thirteenth sensors are positioned to detect whether a substrate is disposed for loading into the fourth chamber;
the fifth, sixth, tenth and fourteenth sensors are positioned to detect whether a substrate is disposed for loading into the fifth chamber;
the sixth, seventh, eighth and eleventh sensors are positioned to detect whether a substrate is disposed for loading into the sixth chamber; and
the first, seventh, ninth and twelfth sensors are positioned to detect whether a substrate is disposed for loading into the seventh chamber.

16. The apparatus of claim 15, wherein:
the seven other chambers are disposed in the following order proceeding clockwise around the transfer chamber: first chamber, second chamber, third chamber, fourth chamber, fifth chamber, sixth chamber, seventh chamber;
the first through seventh sensors are disposed in the following order proceeding clockwise around the transfer chamber: first sensor, second sensor, third sensor, fourth sensor, fifth sensor, sixth sensor, seventh sensor; and
the eighth through fourteenth sensors are disposed in the following order proceeding clockwise around the transfer chamber: eighth sensor, ninth sensor, tenth sensor, eleventh sensor, twelfth sensor, thirteenth sensor, fourteenth sensor.

17. A method of detecting substrates, comprising:
using a first sensor, a second sensor, a tenth sensor and a thirteenth sensor to detect whether a substrate is disposed for loading into a first chamber;
using the second sensor, a third sensor, an eleventh sensor and a fourteenth sensor to detect whether a substrate is disposed for loading into a second chamber;
using the third sensor, a fourth sensor, an eighth sensor and a twelfth sensor to detect whether a substrate is disposed for loading into a third chamber;
using the fourth sensor, a fifth sensor, a ninth sensor and the thirteenth sensor to detect whether a substrate is disposed for loading into a fourth chamber;
using the fifth sensor, a sixth sensor, the tenth sensor and the fourteenth sensor to detect whether a substrate is disposed for loading into a fifth chamber;
using the sixth sensor, a seventh sensor, the eighth sensor and the eleventh sensor to detect whether a substrate is disposed for loading into a sixth chamber; and
using the first sensor, the seventh sensor, the ninth sensor and the twelfth sensor to detect whether a substrate is disposed for loading into a seventh chamber.

* * * * *